(12) United States Patent
Kim et al.

(10) Patent No.: US 8,921,860 B2
(45) Date of Patent: Dec. 30, 2014

(54) ORGANIC LIGHT EMITTING DISPLAY DEVICE

(75) Inventors: Shin-Han Kim, Gyeonggi-Do (KR); Byung-Chul Ahn, Seoul (KR); Yoon-Heung Tak, Gyeonggi-Do (KR); Chang-Wook Han, Seoul (KR); Do-Hyung Kim, Seoul (KR); Jae-Man Lee, Seoul (KR); Hong-Seok Choi, Seoul (KR); Sung-Joon Bae, Gyeonggi-Do (KR); Seung-Ryong Joung, Gyeonggi-Do (KR)

(73) Assignee: LG Display Co., Ltd., Seoul (KR)

( * ) Notice: Subject to any disclaimer, the term of this patent is extended or adjusted under 35 U.S.C. 154(b) by 347 days.

(21) Appl. No.: 13/548,402

(22) Filed: Jul. 13, 2012

(65) Prior Publication Data

US 2013/0015450 A1 Jan. 17, 2013

(30) Foreign Application Priority Data

Jul. 15, 2011 (KR) .................. 10-2011-0070579

(51) Int. Cl.
*H01L 29/04* (2006.01)
*H01L 29/10* (2006.01)
*H01L 51/52* (2006.01)
*H01L 27/32* (2006.01)

(52) U.S. Cl.
CPC ......... *H01L 27/322* (2013.01); *H01L 2251/558* (2013.01); *H01L 51/5275* (2013.01); *H01L 27/3213* (2013.01)
USPC .......................................... 257/59

(58) Field of Classification Search
CPC . H01L 27/1214; H01L 27/12; H01L 29/4908; H01L 29/66765; G02F 1/136227
USPC .......................................... 257/59
See application file for complete search history.

(56) References Cited

U.S. PATENT DOCUMENTS

2006/0214166 A1* 9/2006 Suzuki ........................... 257/59
2007/0051954 A1* 3/2007 Yan ................................ 257/59

* cited by examiner

*Primary Examiner* — Anthony Ho
(74) *Attorney, Agent, or Firm* — Morgan, Lewis & Bockius LLP

(57) ABSTRACT

An organic light emitting display device is provided to avoid color change due to a viewing direction. The organic light emitting display includes a light compensation layer having a refractive index different than that of an insulating layer. The organic light emitting display may be disposed at the side to which light emitted from an organic light emitting layer is entered to change the path and phase of light, thereby coinciding cavity peak phases for each wavelength of white light emitted from an organic light emitting unit.

15 Claims, 6 Drawing Sheets

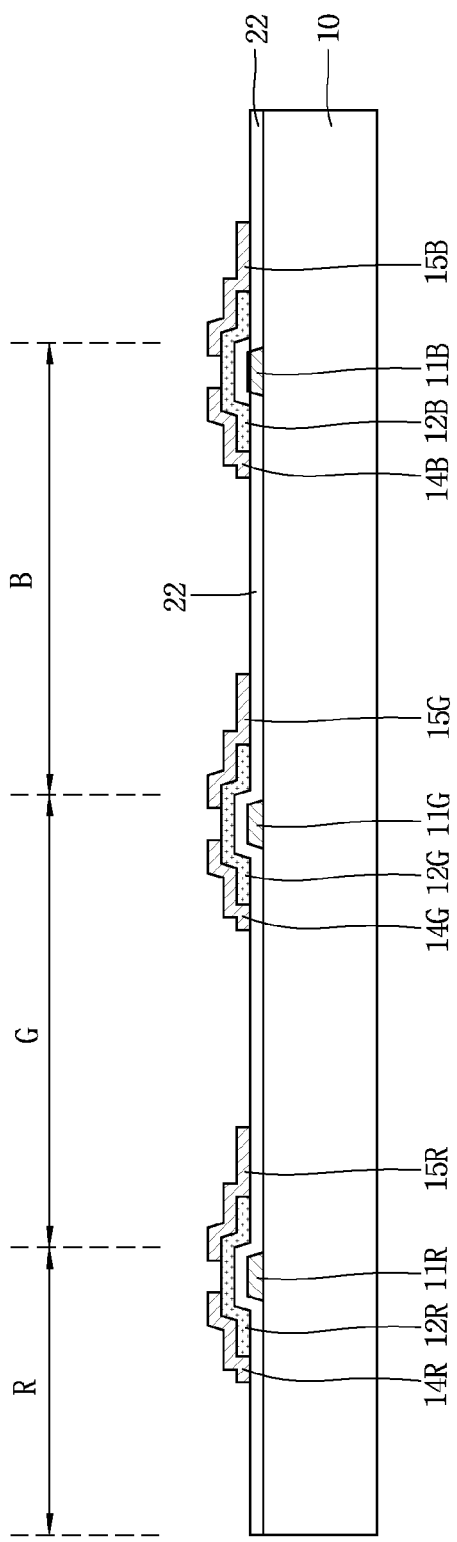

ORGANIC LIGHT EMITTING DISPLAY DEVICE

This application claims the benefit of Korean Patent Application No. 10-2011-0070579, filed in Korea on Jul. 15, 2011, which is hereby incorporated by reference.

BACKGROUND OF THE INVENTION

1. Field of the Invention

The present invention relates to an organic light emitting display device, and more particularly, to an organic light emitting display device that prevents color change due to a viewing angle direction.

2. Discussion of the Related Art

In recent years, since an organic light emitting display device has been developed using poly-phenylene vinylene (PPV), which is a conjugate polymer, studies on organic materials such as a conjugate polymer having good conductivity have been active. Studies for applying such an organic material to a thin-film transistor, a sensor, a laser, a photoelectric element, and the like have been continuously carried out, and among them studies on organic light emitting display devices have been most active.

In case of light emitting display devices made of phosphor-based inorganic materials, an operating voltage above 200 VAC is required and the display device is fabricated by a vacuum deposition process. Such displays are difficult to fabricate with a large-size display, have poor blue light emission characteristics, and have high fabrication cost. However, organic light emitting display devices made of organic materials have been highly regarded as the next generation display devices due to advantages, such as the facilitation of a large-sized screen, the convenience of a fabrication process, and particularly easy implementation of blue light emission, as well as allowing the development of a flexible light emitting display device, and the like.

Similar to liquid crystal display devices, active matrix organic light emitting display devices having an active driving element for each pixel have been considered for implementation as a flat panel display. Such an organic light emitting display device may include an anode, a cathode and an organic light emitting unit therebetween, and the organic light emitting unit emits white color. In the case of emitting white color as described above, the organic light emitting unit is deposited with luminescent materials for emitting red, green and blue, and thus, the combined light thereof becomes white color.

However, in the case of an organic light emitting display device for emitting white color, the locations of luminescent materials (or emission layers) for emitting red light, green light and blue light are different, thereby causing difficulty in coinciding cavity peak phases for each wavelength. As a result, variation between a cavity peak and a photoluminescence peak may occur, thereby causing a problem of reducing image quality.

SUMMARY OF THE INVENTION

Accordingly, the present invention is directed to a organic light emitting display device that substantially obviates one or more of the problems due to limitations and disadvantages of the related art.

An object of the present invention is to provide an organic light emitting display device in which a light compensation layer is disposed to compensate the path and phase difference of emissive lights, thereby coinciding cavity peak phases, and as a result preventing color change from being occurred.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, an organic light emitting display device comprises a substrate having a plurality of R, G, B pixels; a thin-film transistor at each of the R, G, B pixels; R, G, B color filter layers respectively at each of the R, G, B pixels; an insulating layer on the R, G, B color filter layers having a first refractive index; a light compensation layer on the insulating layer having a second refractive index different than the first refractive index; a plurality of pixel electrodes on the light compensation layer at each one of the R, G, B pixels; a light emitting unit on the respective pixel electrodes to emit light; and a plurality of common electrodes on the organic light emitting units, wherein the pixel electrode, first insulating layer and light compensation layer in each pixel have the following relation:

$$\sum_i \frac{n_i^0 d_i^0}{\lambda_b} + \frac{n^a d^a}{\lambda_b} + \sum_j \frac{n_j^w d_j^w}{\lambda_b} = 1.7 \sim 2.5$$

where $d^0$, $d^a$, $d^w$ are thicknesses of the light compensation layer, pixel electrode and organic light emitting unit, respectively, $n^0$, $n^a$, $n^w$ are refractive indices of the light compensation layer, pixel electrode and organic light emitting unit, respectively, and $\lambda_b$ is the peak wavelength of blue-light emitted from the organic light emitting unit.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings:

FIGS. 3A to 3D are views illustrating a method of fabricating an organic light emitting display device according to an example embodiment.

DETAILED DESCRIPTION OF THE INVENTION

Reference will now be made in detail to embodiments of the present invention, examples of which are illustrated in the accompanying drawings.

According to example embodiments of the present invention, when luminescent materials for emitting red, green and blue are deposited to emit white light, color changes occurring due to the mismatch of cavity peaks can be prevented. In general, mismatched cavity peaks may be caused by a phase and path difference between light emitted from each luminescent material and light reflected by a reflective layer in the organic light emitting unit. Accordingly, if a thickness of the light emitting unit is drastically increased, then it may be possible to control a phase between light emitted from each luminescent material and light reflected by a reflective layer to coincide a phase difference between both of them, but in this case, the thickness of the light emitting unit is increased, and thus, the thickness of the entire organic light emitting display device is increased and a large quantity of high cost organic luminescent materials are required, thereby increasing the fabrication cost.

Furthermore, the path and phase difference may be compensated by controlling the thickness of various layers formed at the emission side of the light emitting unit, but in this case, a long period of deposition may be also required to form a thick layer, thereby slowing the process and increasing the cost as well as increasing a driving voltage due to the increased thickness.

According to examples of the present invention, an additional layer may be added without increasing a thickness of the light emitting unit and a thickness of the layer to prevent color changes according to a viewing angle direction. As a result, an excessively increased thickness of the layer and a thickness of the light emitting unit may not be required, thereby avoiding problems, such as process delay, increased cost, and increased driving voltage.

Figure 1:
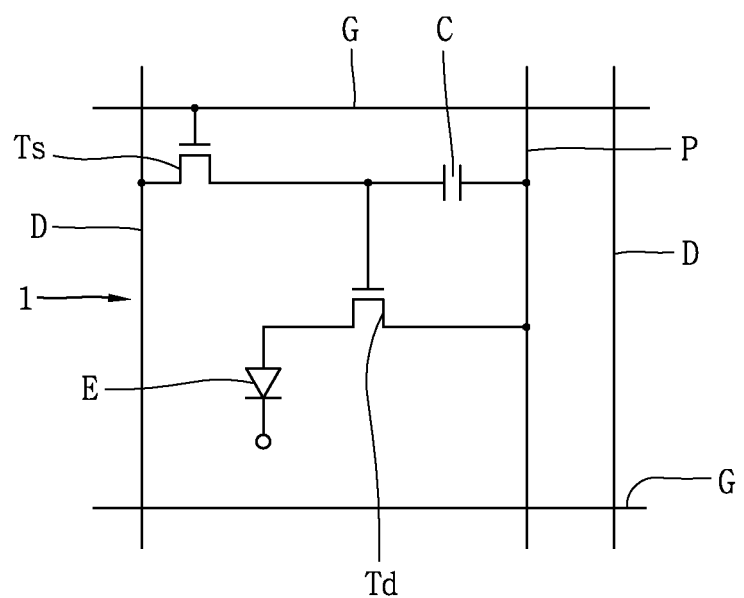
FIG. 1 is a view illustrating an equivalent circuit diagram of an organic light emitting display device.

FIG. 1 is a view illustrating an equivalent circuit diagram of an organic light emitting display device according to the present invention. As illustrated in FIG. 1, an organic light emitting display device 1 may be composed of a plurality of pixels defined by a gate line (G) and a data line (D) crossed in the vertical and horizontal directions, respectively, and a power line (P) may be arranged parallel to the data line (D). A switching thin-film transistor (Ts), a driving thin-film transistor (Td), a capacitor (C), and an organic light emitting element (E) may be provided within each pixel. A gate electrode of the switching thin-film transistor (Ts) is connected to the data line (D), and a drain electrode thereof is connected to a gate electrode of the driving thin-film transistor (Td). Furthermore, a source electrode of the driving thin-film transistor (Td) is connected to the power line (P) and a drain electrode thereof is connected to the light emitting element (E).

When a scan signal is received through the gate line (G) in the organic light emitting display device having the foregoing configuration, the signal is applied to a gate electrode of the switching thin-film transistor (Ts) to drive the switching thin-film transistor (Ts). As the switching thin-film transistor (Ts) is driven, a data signal being received through the data line (D) is received at a gate electrode of the driving thin-film transistor (Td) through the source electrode and drain electrode to drive the driving thin-film transistor (Td). At this time, a current flows through the power line (P), and as the driving thin-film transistor (Td) is driven, the current of the power line (P) is applied to the light emitting element (E) through the source electrode and drain electrode. A size of the current outputted through the driving thin-film transistor (Td) varies according to a voltage between the gate electrode and the drain electrode.

As an organic light emitting element, the light emitting element (E) emits light as the current is received through the driving thin-film transistor (Td) to display an image. The intensity of light emission varies according to the intensity of a current being applied thereto, and thus the intensity of light can be controlled by controlling the intensity of the current.

Figure 2:
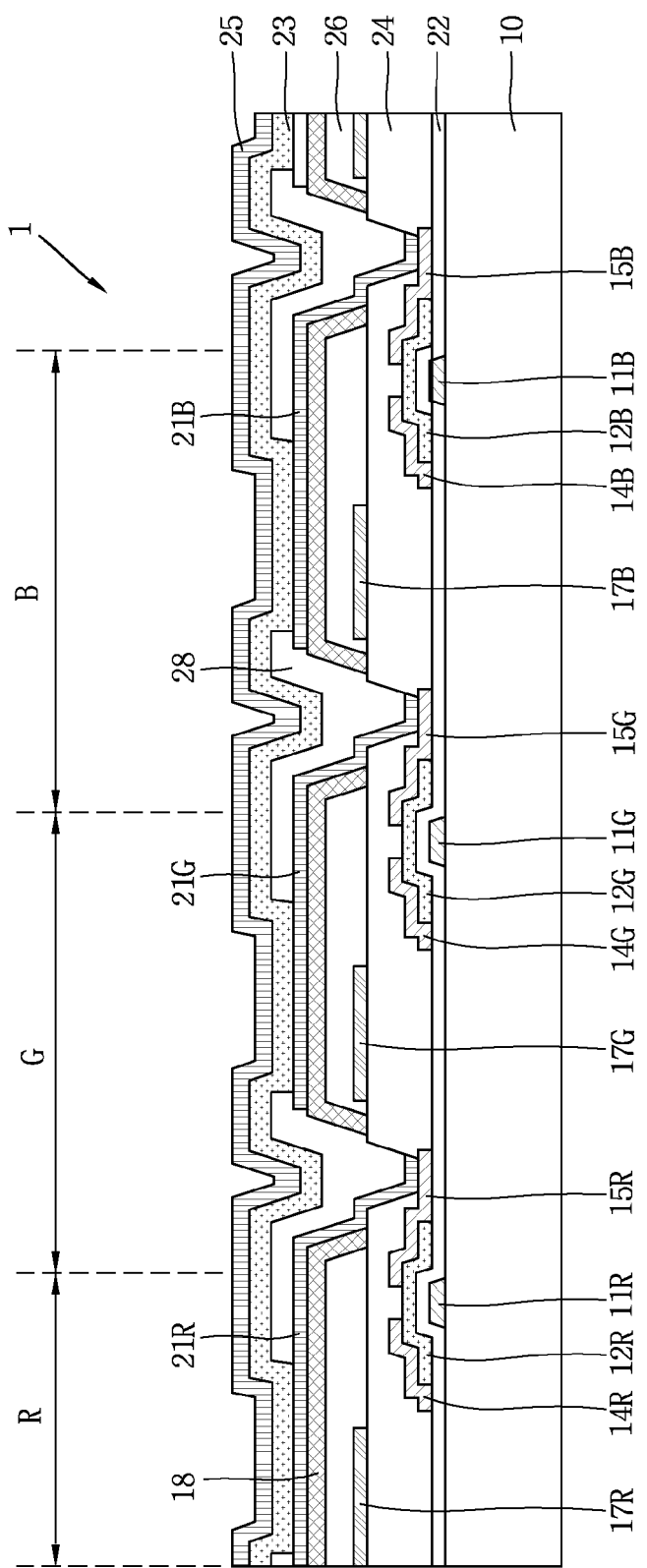
FIG. 2 is a cross-sectional view illustrating the structure of an organic light emitting display device according to an example embodiment.

FIG. 2 is a cross-sectional view illustrating the structure of an example embodiment of an organic light emitting display device. The structure of an organic light emitting display device according to FIG. 2 will be described below.

As illustrated in FIG. 2, an organic light emitting display device may include a pixel R for outputting red light, and a pixel G for outputting green light, and a pixel B for outputting blue light. Though not shown in the drawing, an organic light emitting display device according to the present invention may include a pixel W for outputting white light. In this case, the pixel W outputs white light to enhance the entire luminance of the organic light emitting display device.

Though will be described later, a color filter layer is formed at each pixel (R, G, B) to output white light being outputted from the organic light emitting unit as a specific color light, but when the pixel W is disposed thereon, white light is outputted as it is from the pixel W without requiring of such a color filter layer.

As illustrated in FIG. 2, a substrate 10 made of a transparent material such as glass or plastic is divided into R, G, B pixels, and a thin-film transistor is formed at each of the R, G, B pixels. The driving thin-film transistor may include a gate electrode (11R, 11G, 11B) formed at the pixel (R, G, B), respectively, on the substrate 10, and a semiconductor layer (12R, 12G, 12B) formed over the entire surface of the substrate 10 formed with the gate electrode (11R, 11G, 11B), and a source electrode (14R, 14G, 14B) and a drain electrode (15R, 15G, 15B) formed on the semiconductor layer (12R, 12G, 12B). Though not shown in FIG. 2, an etching stopper is formed at part of the upper surface of the semiconductor layer (12R, 12G, 12B) to prevent the semiconductor layer (12R, 12G, 12B) from being etched during the etching process of the source electrode (14R, 14G, 14B) and drain electrode (15R, 15G, 15B).

The gate electrode (11R, 11G, 11B) may be formed of a metal, such as Cr, Mo, Ta, Cu, Ti, Al or Al-alloy, and the gate insulating layer 22 may be a single layer made of an inorganic material, such as $SiO_2$ or SiNx, or a double layer made of $SiO_2$ and SiNx. The semiconductor layer (12R, 12G, 12B) may be formed of an amorphous semiconductor (a-Si), a crystalline semiconductor, a transparent oxide semiconductor, such as indium gallium zinc oxide (IGZO). Furthermore, the source electrode (14R, 14G, 14B) and drain electrode (15R, 15G, 15B) may be formed of Cr, Mo, Ta, Cu, Ti, Al, Al-alloy, or other suitable conductive material.

A first insulating layer 24 may be formed on the substrate 10 formed with the driving thin-film transistor. The first insulating layer 24 may be formed of an inorganic material with a thickness of about 4500 Å. An R-color filter layer 17R, a G-color filter layer 17G, and a B-color filter layer 17B are formed on the R, G, B pixels, respectively, of the first insulating layer 24.

A second insulating layer 26 is formed on the R-color filter layer 17R, G-color filter layer 17G, and B-color filter layer 17B. As an overcoat layer for planarizing the substrate 10, the second insulating layer 26 may be formed of an organic insulating material such as photoacryl with a thickness of about 3 μm.

A light compensation layer 18 is formed on the second insulating layer 26, and a pixel electrode (21R, 21G, 21B) and an organic light emitting unit 23 are formed thereon. At this time, a contact hole 29 is formed on the first insulating layer 24, second insulating layer 26, and light compensation layer 18 of the drain electrode (15R, 15G, 15B) of a thin-film transistor formed on the pixel (R, G, B), respectively, and thus the light compensation layer 27 and pixel electrode (21R, 21G, 21B) is formed on the contact hole 29, and the pixel electrode (21R, 21G, 21B) is electrically connected to the drain electrode (15R, 15G, 15B), respectively, of the thin-film transistor.

Furthermore, a bank layer 28 is formed at each pixel boundary region on the light compensation layer 18. As a kind of partition wall, the bank layer 28 partitions off each pixel to prevent a specific color light outputted from the adjacent pixel from being mixed. In addition, the bank layer 28 fills up a portion of the contact hole 29 to decrease the step, thereby preventing a failure at the organic light emitting unit 23 due to an excessive step during the formation of the organic light emitting unit 23.

The pixel electrode (21R, 21G, 21B) may be made of a transparent metal oxide material, such as indium tin oxide (ITO) or indium zinc oxide (IZO), and the pixel electrode (21R, 21G, 21B) can be formed with a thickness of about 500 Å on the pixel (R, G, B), respectively.

The organic light emitting unit 23 may include a white organic light emitting layer for emitting white light, and the white organic light emitting layer may be formed such that a plurality of organic materials for emitting R, G, B monochrome lights, respectively, are mixed with one another, or may be formed such that a plurality of light emitting layers for emitting R, G, B monochrome lights, respectively, are deposited on one another. Though not shown in FIG. 2, the organic light emitting unit 23 may be formed with an organic light emitting layer as well as with an electron injection layer and a hole injection layer for injecting electrons and holes, respectively, and an electron transport layer and a hole transport layer for transporting the injected electrons and holes to the organic light emitting layer, respectively.

The light emitting layer may be formed in a plurality of light emitting layers. At this time, at least one charge generation layer is disposed between the light emitting layers. For example, only one charge generation layer is disposed between the two light emitting layers in case where the light emitting unit includes two light emitting layers and the two charge generation layer are respectively disposed between three light emitting layers in case where the light emitting unit includes three light emitting layers.

The electron injection layer, the hole injection layer, the electron transport layer, and the hole transport layer is disposed outer region of a plurality of light emitting layers, not between the light emitting layers. For example, The electron injection layer, the electron transport layer, first light emitting layer, the charge generation layer, the hole transport layer, and the hole injection layer can be sequentially disposed to form the light emitting unit.

When the a plurality of light emitting layers is formed in the light emitting unit, the charge is sufficiently supplied to the light emitting layers by the charge generation layer, thereby the emitting efficiency is increased.

The charge generation layer includes n-type charge generation layer for generating n-type charge and includes p-type charge generation layer for generating p-type charge.

The light compensation layer 18 compensates the path of light emitted from the organic light emitting unit 23 to coincide cavity peak phases for each wavelength of red light, green light, and blue light emitted from a white organic light emitting layer, and a material having a different refractive index from that of the second insulating layer 26 deposited at a lower portion thereof is used for the light compensation layer 18, and the reason is described as follows.

When the light compensation layer 18 is formed with a material having the same refractive index as that of the second insulating layer 26, a thickness of the light compensation layer 18 should be drastically increased to control the light path as a desired path so as to coincide cavity peak phases for each light wavelength by changing the path of light incident to the light compensation layer 18. However, in this case, the purpose of coinciding cavity peak phases by the compensation of light path can be accomplished, but the entire thickness of the organic light emitting display device may be increased, thereby increasing the cost and delaying the process.

However, the light compensation layer 18 has a different refractive index from that of the second insulating layer 26 to generate light path change and phase delay due to a refractive index difference between the layers, thereby coinciding cavity peak phases for each light wavelength even when the light compensation layer 18 is formed with a layer having a relatively low thickness.

Any material may be used for the light compensation layer 18 if it has a refractive index different than that of a material forming the second insulating layer 26 such as $SiO_2$ or the like. According to the present invention, SiNx, TiOx, SiNx, MgF, CaF, or the like may be used for the light compensation layer 18. In this case, a signal material may be used but also two or more materials may be mixed and used for the light compensation layer 18.

A common electrode 25 is formed over the entire surface of the substrate 10 on the organic light emitting unit 23. The common electrode 25 is made of Ca, Ba, Mg, Al, Ag, and the like. Here, the common electrode 25 is a cathode of the organic light emitting unit 23 and the pixel electrode (21R, 21G, 21B) is an anode thereof, and when a voltage is applied to the common electrode 25 and pixel electrode (21R, 21G, 21B), electrons are injected to the organic light emitting unit 23 from the common electrode 25, and holes are injected to the organic light emitting unit 23 from the pixel electrode (21R, 21G, 21B) to generate excitons within the organic light emitting layer, and as the excitons are decayed, light corresponding to a difference between the lowest unoccupied molecular orbital (LUMO) and the highest occupied molecular orbital (HOMO) is produced and emitted to the outside (toward the substrate 10 in the drawing). At this time, red, green, and blue light are emitted from R, G, B light emitting layers, respectively, contained in the organic light emitting layer, and those lights are mixed to emit white light. The emitted white light outputs only the light of a color corresponding to the relevant pixel while penetrating the color filter layer (17R, 17G, 17B), respectively.

As described above, white light emitted from the organic light emitting unit 23 passes through the pixel electrode 21R, 21G, 21B, light compensation layer 18, second insulating layer 26, first insulating layer 24, and substrate 10 to be output to the outside. At this time, light output to an upper portion of the 23, namely, light incident to the common electrode 25 is reflected by the common electrode 25 and output to the side of the substrate 10. Accordingly, a path and phase difference occurs between light reflected from the common electrode 25 and light immediately output from the organic light emitting unit 23. Furthermore, organic light emitting layers emitting red light, green light and blue light, which are combined into white light, have different locations, and thus the path and phase difference of a specific color light emitted from the organic light emitting layers, respectively, is different than that of the other colors of light. Accordingly, cavity peak phases for each color are different due to the path and phase difference for each color, thereby causing color change according to a viewing angle when being mixed into white light to implement an image.

The light path and phase difference of light being output from the organic light emitting unit 23 is compensated by the light compensation layer 18. In other words, the path of light emitted from the organic light emitting unit 23 and incident to the light compensation layer 18 is changed within the light compensation layer 18 to compensate the light path and phase difference. At this time, the light path of light incident to the light compensation layer 18 may be drastically changed since the light compensation layer 18 has a different refractive index than that of the second insulating layer 26 at a lower portion thereof, and thus the light path can be changed as much as a desired level even if it is formed with a relatively low thickness, thereby removing a light path difference or phase difference.

In actuality, the compensation of a light path and phase difference is determined by a thickness of the light compensation layer 18 as well as determined by a total thickness of the organic light emitting unit 23, lower pixel electrode 21R, 21G, 21B, and light compensation layer 18, and their refractive indices.

Equation 1 illustrates a condition that the light path and phase difference is compensated not to cause color change when light is output from the organic light emitting unit 23 through the pixel electrode 21R, 21G, 21B and light compensation layer 18.

$$\sum_i \frac{n_i^0 d_i^0}{\lambda_b} + \frac{n^a d^a}{\lambda_b} + \sum_j \frac{n_j^w d_j^w}{\lambda_b} = 1.7 \sim 2.5 \qquad \text{Equation 1}$$

Here, where $d^0$, $d^a$, $d^w$ are thicknesses of the light compensation layer 18, pixel electrode 21R, 21G, 21B and organic light emitting unit 23, respectively, and $n^0$, $n^a$, $n^w$ are refractive indices of the light compensation layer 18, pixel electrode 21R, 21G, 21B and organic light emitting unit 23, respectively, and $\lambda_b$ is a peak wavelength of blue-light emitted from the organic light emitting unit 23.

As disclosed in Equation 1, a condition that does not cause color change may be a case where a relation between thicknesses of the pixel electrode 21R, 21G, 21B, organic light emitting unit 23, and light compensation layer 18, refractive indices of the pixel electrode 21R, 21G, 21B, organic light emitting unit 23, and light compensation layer 18, and a wavelength of light is 1.7-2.5.

If the thicknesses ($d^w$, $d^a$) and refractive indices ($n^w$, $n^a$) of the organic light emitting unit 23 and pixel electrode 21R, 21G, 21B and a wavelength of light ($\lambda$b) are constant, the thickness) ($d^0$) and refractive index ($n^0$) of the light compensation layer 18 may be properly selected to satisfy the condition of Equation 1. In other words, thicknesses thereof may be formed in a different manner according to the kind of material of the light compensation layer 18 to satisfy the condition of Equation 1. When an organic material, an inorganic material or an organic metal compound having a different refractive index than that of the second insulating layer 26 is used for the light compensation layer 18, a total thickness of the pixel electrode 21R, 21G, 21B, organic light emitting unit 23 and light compensation layer 18 is set to 5000-6000 Å to satisfy Equation 1 when the maximum wavelength intensity of light output from the organic light emitting unit 23 is 440-470 nm or 550-580 nm. That is, a total thickness of the pixel electrode 21R, 21G, 21B, organic light emitting unit 23 and light compensation layer 18 is set to 5000-6000 Å, cavity peaks for each wavelength are coincided, thereby preventing color change due to a viewing angle direction.

Any material may be used for the light compensation layer 18 if it has a different refractive index from that of a material forming the second insulating layer 26. For example, it may be formed of an organic material, such as benzo cyclo butene (BCB), an inorganic material, such as $SiO_2$ or SiNx, or an organic metal compound, such as TiOx, MgF and CaF.

When the organic light emitting unit 23 is formed with a thickness of about 2000-4000 Å and the ITO of the pixel electrode 21R, 21G, 21B is formed with a thickness of 300-700 Å, the light compensation layer 18 made of an inorganic material such as SiNx is formed with a thickness of about 1000-3000 Å. When the light compensation layer 18 is formed of a different material, it may be possible to calculate an optimal thickness that does not cause color change if it is calculated according to Equation 1 by taking a refractive index of the relevant material into consideration.

When the light compensation layer 18 is formed of a material having a high refractive index, the thickness thereof is decreased compared to a case where the light compensation layer 18 is formed of a material having a low refractive index.

As described above, assuming that thicknesses ($d^w$, $d^a$) and refractive indices ($n^w$, $n^a$) of the organic light emitting unit 23 and pixel electrode 21R, 21G, 21B and a wavelength of light ($\lambda_b$) are constant, it may be possible to fabricate an organic light emitting display device with no color change by calculating the thickness ($d^0$) and refractive index ($n^0$) of the light compensation layer 18 for satisfying the condition of Equation 1 to form the light compensation layer 18. However, it may be also possible to satisfy Equation 1 by configuring that thicknesses ($d^w$, $d^0$) and refractive indices ($n^w$, $n^0$) of the organic light emitting unit 23 and light compensation layer 18 and a wavelength of light ($\lambda_b$) are constant, and a thickness ($d^a$) and refractive index ($n^a$) of the pixel electrode 21R, 21G, 21B is different.

As described above, the light compensation layer 18 having a different refractive index than that of the second insulating layer 26 may be formed, and thus, cavity peak phases for each wavelength of emissive light are coincided by changing the path and phase difference of light emitted from the organic light emitting unit 23, thereby preventing color change due to a viewing angle.

Hereinafter, a method of fabricating an organic light emitting display device having the foregoing structure will be described as follows. FIGS. 3A to 3D are views illustrating a method of fabricating an organic light emitting display device according to an example embodiment.

First, as illustrated in FIG. 3A, a non-transparent material having a good conductivity such as Cr, Mo, Ta, Cu, Ti, Al or Al-alloy is deposited on the substrate 10 made of a transparent material, such as glass or plastic, by a sputtering process and then etched by a photolithography process to form the gate electrode (11R, 11G, 11B), and then an inorganic insulating material is deposited over the entire surface of the substrate 10 by a chemical vapor deposition (CVD) process to form a gate insulating layer 22. At this time, for the gate insulating layer 22, SiNx may be formed, for example, at a thickness of about 2000 Å.

Subsequently, a semiconductor material such as amorphous silicon (a-Si), a transparent oxide semiconductor, such as indium gallium zinc oxide (IGZO), or an organic semiconductor is deposited over the substrate 10 by the CVD process and then etched to form the semiconductor layer (12R, 12G, 12B). Furthermore, though not shown in the drawing, impurities are doped into part of the semiconductor layer (12R, 12G, 12B) or amorphous silicon to which impurities have been added is deposited to form an ohmic contact layer.

Then, a non-transparent metal having a good conductivity, such as Cr, Mo, Ta, Cu, Ti, Al or Al-alloy, is deposited on the substrate 10 by a sputtering process and then etched to form the source electrode (14R, 14G, 14B) and drain electrode (15R, 15G, 15B) on the semiconductor layer (12R, 12G, 12B), strictly speaking, on the ohmic contact layer.

Figure 3B:
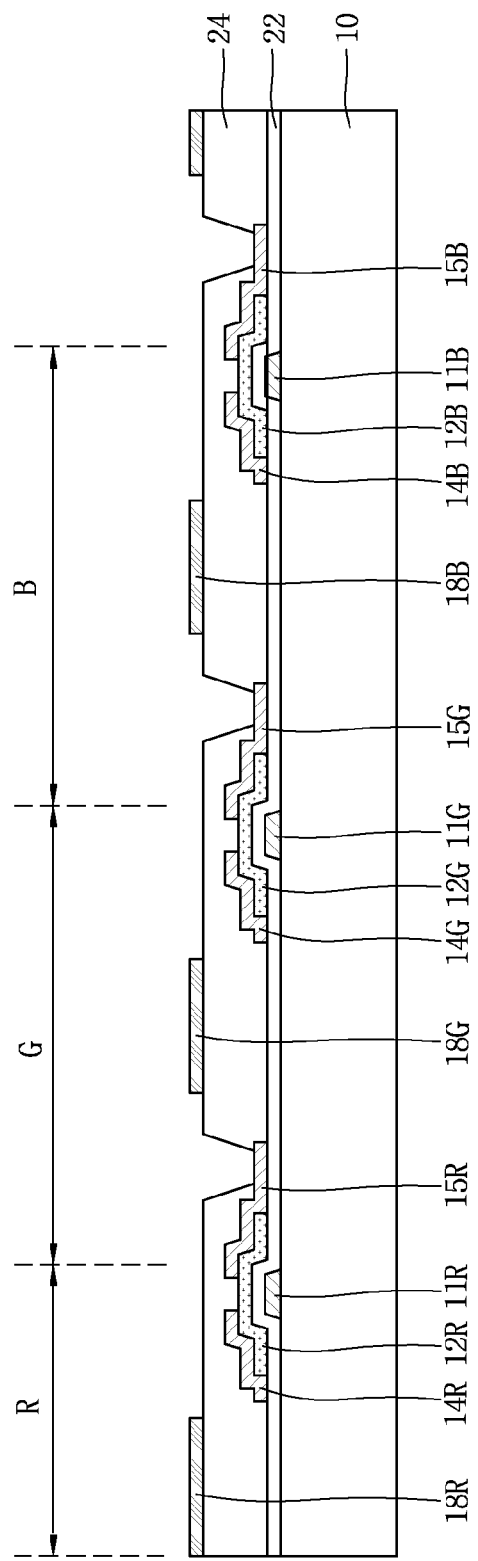

Then, as illustrated in FIG. 3B, an inorganic insulating material is deposited over the entire surface of the substrate 10 having the source electrode (14R, 14G, 14B) and drain electrode (15R, 15G, 15B) to form the first insulating layer 24 and some regions thereof are etched to form a contact hole 29. At this time, $SiO_2$ may be formed at a thickness of about 4500 Å for the first insulating layer 24, and the drain electrode (15R, 15G, 15B) of the thin-film transistor is exposed to the outside by the contact hole 29. Subsequently, the R-color filter layer 17R, G-color filter layer 17G, and B-color filter layer 17B may be formed on the R, G, B pixels, respectively, on the first insulating layer 24.

Figure 3C:
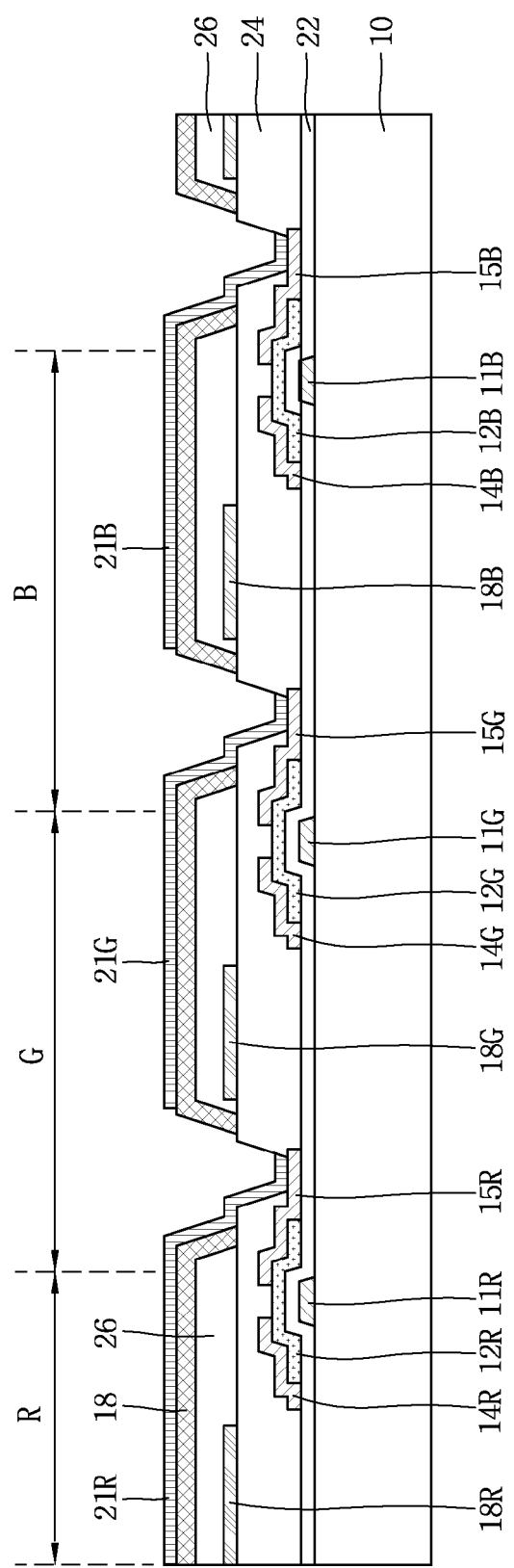

Subsequently, as illustrated in FIG. 3C, an organic insulating material, such as photoacryl, is coated over the entire surface of the substrate 10 formed with the R-color filter layer 17R, G-color filter layer 17G, and B-color filter layer 17B to deposit the second insulating layer 26 formed with the contact hole 29. At this time, the second insulating layer 26 may be formed at a thickness of about 3 µm, and the second insulating layer 26 in a region formed with the contact hole 29 may be also etched to expose the drain electrode (15R, 15G, 15B) to the outside.

Then, the light compensation layer 18 is formed on the second insulating layer 26. The light compensation layer 18 may be formed by depositing an organic material, an inorganic material, such as $SiO_2$ or SiNx, or an organic metal compound, such as TiOx, MgF, CaF or the like. At this time, the light compensation layer 18 in a region formed with the contact hole 29 may be also etched to expose the drain electrode (15R, 15G, 15B) to the outside.

On the other hand, according to the foregoing description, the contact hole 29 is formed by individual processes for the first insulating layer 24, second insulating layer 26 and light compensation layer 18, but the contact hole 29 may be also formed at the same time. In other words, the first insulating layer 24, second insulating layer 26 and light compensation layer 18 are sequentially deposited and then those sequentially deposited layers are etched by a single etching process to form the contact hole 29.

Subsequently, a transparent conductive material, such as ITO or IZO, is deposited on the light compensation layer 27 and then etched to form the pixel electrode (21R, 21G, 21B). At this time, the pixel electrode (21R, 21G, 21B) is extended to an inner portion of the contact hole 29 to be electrically connected to the drain electrode (15R, 15G, 15B) of the thin-film transistor. Furthermore, the pixel electrode (21R, 21G, 21B) of the relevant pixel is electrically insulated from the pixel electrode (21R, 21G, 21B) of the adjacent pixel.

Figure 3D:
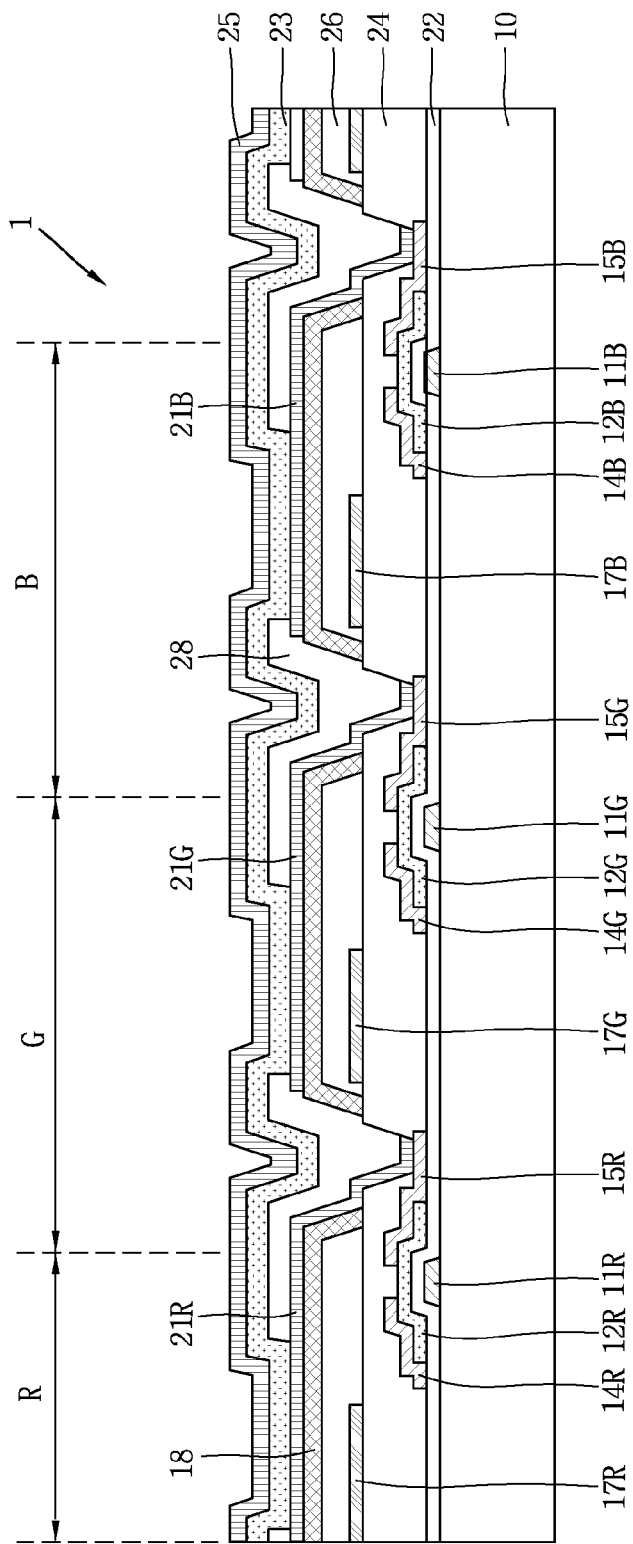

Then, as illustrated in FIG. 3D, a bank layer 28 is formed between each pixel. The bank layer 28 partitions off each pixel to prevent a specific color light outputted from the adjacent pixel from being mixed, and fills up a portion of the contact hole 29 to decrease the step. The bank layer 28 may be formed by depositing and etching an inorganic insulating material using the CVD process or may be formed by depositing an organic insulating material and then etching it.

Subsequently, the organic light emitting unit 23 is formed over the entire surface of the substrate 10 formed with the bank layer 28 and pixel electrode (21R, 21G, 21B). The organic light emitting unit 23 is composed of an electron injection layer, an electron transport layer, a white organic light emitting layer, a hole transport layer and a hole injection layer, and the white organic light emitting layer may be a layer mixed with a R-organic light emitting material, a G-organic light emitting material, and a B-organic light emitting material, or a structure on which a R-organic light emitting layer, a G-organic light emitting layer, and a B-organic light emitting layer are deposited. The electron injection layer, electron transport layer, organic light emitting layer, hole transport layer and hole injection layer may be formed by depositing various materials currently being used. Then a metal, such as Ca, Ba, Mg, Al, Ag, or the like, is deposited on the organic light emitting unit 23 to form the common electrode 25, thereby completing an organic light emitting display device.

As described above, the light compensation layer 18 may be formed between the pixel electrode 21R, 21G, 21B and second insulating layer 26 at a lower portion of the organic light emitting unit 23, and thus a path and phase difference of light emitted from the organic light emitting unit 23 may be controlled to coincide cavity peak phases for each wavelength, thereby preventing variation between a cavity peak and a photoluminescence peak, and as a result preventing color change from being occurred according to a viewing angle direction.

On the other hand, the organic light emitting display device having a specific structure has been disclosed as an organic light emitting display device in the foregoing detailed description, but the present invention will not be limited to the organic light emitting display device having such a specific structure. If the light compensation layer made of a material having a different refractive index from that of the second insulating layer capable of coinciding cavity peak phases for each wavelength of light is merely formed therein, it may be applicable to all kinds of organic light emitting display devices with a widely known structure.

The organic light emitting unit may include an organic light emitting layer configured to output white light or an organic light emitting layer configured to emit red light, an organic light emitting layer configured to emit green light, and an organic light emitting layer configured to emit blue light.

The pixel electrode may be made of a transparent conductive material as an anode and the common electrode may be made of a metal as a cathode. The light compensation layer may be made of an organic insulating material, an inorganic insulating material, or an organic metal compound. A total thickness of the pixel electrode, light compensation layer and organic light emitting unit may be 5000-6000 Å when the maximum wavelength intensity of white light emitted from the organic light emitting unit is 440-470 nm or 550-580 nm, and the organic light emitting unit is formed with a thickness of 1000-3000 Å, and the pixel electrode made of ITO is formed with a thickness of 300-700 Å, and the organic light emitting unit is formed with a thickness of 2000-4000 Å when the maximum wavelength intensity of white light emitted from the organic light emitting unit is 440-470 nm or 550-580 nm.

As described above, the light compensation layer having a different refractive index from that of the insulating layer adjacent thereto may be provided to compensate the path and phase difference of incident lights emitted from the organic light emitting unit, thereby coinciding cavity peak phases over the entire white light and as a result preventing color from being changed according to a viewing angle direction.

Furthermore, the light compensation layer may be formed of a material having a different refractive index from that of the insulating layer and thus the thickness thereof may be reduced compared to a case where the light compensation layer is formed of a material having the same refractive index, thereby reducing the fabrication cost and decreasing the process time, as well as reducing a driving voltage according to the thickness reduction.

It will be apparent to those skilled in the art that various modifications and variations can be made in the organic light emitting display device of the present invention without departing from the spirit or scope of the invention. Thus, it is intended that the present invention cover the modifications and variations of this invention provided they come within the scope of the appended claims and their equivalents.

What is claimed is:

1. An organic light emitting display device, comprising:
   a substrate having a plurality of R, G, B pixels;
   a thin-film transistor at each of the R, G, B pixels;
   an insulating layer on the thin-film transistor having a first refractive index;
   a light compensation layer on the insulating layer having a second refractive index different than the first refractive index;
   a plurality of pixel electrodes on the light compensation layer at each one of the R, G, B pixels;
   a light emitting unit on the respective pixel electrodes to emit light; and
   common electrode on the organic light emitting units,
   wherein the light compensation layer, the pixel electrode, and the organic light emitting unit in each pixel have the following relation:

$$\sum_i \frac{n_i^0 d_i^0}{\lambda_b} + \frac{n^a d^a}{\lambda_b} + \sum_j \frac{n_j^w d_j^w}{\lambda_b} = 1.7 \sim 2.5$$

where $d^0$, $d^a$, $d^w$ are thicknesses of the light compensation layer, pixel electrode and organic light emitting unit, respectively, $n^0$, $n^a$, $n^w$ are refractive indices of the light compensation layer, pixel electrode and organic light emitting unit, respectively, and $\lambda_b$ is the peak wavelength of blue-light emitted from the organic light emitting unit.

2. The organic light emitting display device of claim 1, wherein the organic light emitting unit is a white organic emitting unit for emitting white light.

3. The organic light emitting display device of claim 2, further comprising a R,G,B color filter layers formed respectively at each pixel of R,G,B pixels.

4. The organic light emitting display device of claim 1, wherein the organic light emitting unit comprises;
   a plurality of organic light emitting layers for emitting the light; and
   at least one charge generation layer between the organic light emitting layers.

5. The organic light emitting display device of claim 4, wherein the charge generation layer includes n-type charge generation layer for generating n-type charges and p-type charge generation layer for generating p-type charges.

6. The organic light emitting display device of claim 4, wherein the organic light emitting unit further comprises:
   an electron injection layer for injecting electrons into the organic light emitting layer;
   an electron transport layer for transporting electrons injected through the electron injection layer to the organic light emitting layer;
   a hole injection layer for injecting holes into the organic light emitting layer; and
   a hole transport layer for transporting holes injected through the hole injection layer.

7. The organic light emitting display device of claim 1, wherein each pixel electrode is an anode and the common electrode is a cathode.

8. The organic light emitting display device of claim 1, wherein the pixel electrodes include a transparent conductive material and the cathode includes a metal.

9. The organic light emitting display device of claim 1, wherein the insulating layer includes an organic insulating material.

10. The organic light emitting display device of claim 1, wherein the light compensation layer includes a material selected from the group consisting an organic insulating material, an inorganic insulating material, and an organic metal compound.

11. The organic light emitting display device of claim 1, wherein the light compensation layer is single layer or multi layers.

12. The organic light emitting display device of claim 1, wherein a total thickness of the pixel electrode, light compensation layer and organic light emitting unit is 5000-6000 Å when the maximum wavelength intensity of white light emitted from the organic light emitting unit is 440-470 nm or 550-580 nm.

13. The organic light emitting display device of claim 12, wherein the organic light emitting unit is formed with a thickness of 1000-3000 Å, and the pixel electrodes is formed with a thickness of 300-700 Å, and the organic light emitting unit is formed with a thickness of 2000-4000 Å when the maximum wavelength intensity of white light emitted from the organic light emitting unit is 440-470 nm or 550-580 nm.

14. The organic light emitting display device of claim 1, further comprising a plurality of thin-film transistors (TFTs) formed on the substrate and a TFT covering insulating layer formed on the substrate to cover the TFTs.

15. The organic light emitting display device of claim 1, further comprising a W pixel configured to output white light emitted from the organic light emitting unit.

* * * * *